US011676802B2

(12) United States Patent
Boyd, Jr. et al.

(10) Patent No.: US 11,676,802 B2
(45) Date of Patent: Jun. 13, 2023

(54) SUBSTRATE SUPPORT WITH REAL TIME FORCE AND FILM STRESS CONTROL

(71) Applicant: Applied Materials, Inc., Santa Clara, CA (US)

(72) Inventors: Wendell Glenn Boyd, Jr., Morgan Hill, CA (US); Govinda Raj, Santa Clara, CA (US); Matthew James Busche, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 242 days.

(21) Appl. No.: 17/095,577

(22) Filed: Nov. 11, 2020

(65) Prior Publication Data

US 2021/0066038 A1 Mar. 4, 2021

Related U.S. Application Data

(63) Continuation of application No. 14/852,485, filed on Sep. 11, 2015, now Pat. No. 10,879,046.

(51) Int. Cl.
*G01D 5/26* (2006.01)
*H01J 37/32* (2006.01)
(Continued)

(52) U.S. Cl.
CPC ...... *H01J 37/3244* (2013.01); *C23C 16/4586* (2013.01); *H01J 37/32009* (2013.01); *H01J 37/3299* (2013.01); *H01J 37/32697* (2013.01); *H01J 37/32715* (2013.01); *H01L 21/6831* (2013.01); *H01L 21/6833* (2013.01);
(Continued)

(58) Field of Classification Search
None
See application file for complete search history.

(56) References Cited

U.S. PATENT DOCUMENTS 6,432,208 B1 8/2002 Kawakami et al.
2001/0055189 A1 12/2001 Hagi
(Continued)

FOREIGN PATENT DOCUMENTS

JP H04193951 A 7/1992
JP H05129421 A 5/1993
(Continued)

OTHER PUBLICATIONS

Office Action from Chinese Patent Application No. 201610815239.3 dated Apr. 25, 2022.
(Continued)

*Primary Examiner* — Lisa M Caputo
*Assistant Examiner* — Nigel H Plumb
(74) *Attorney, Agent, or Firm* — Patterson + Sheridan, LLP

(57) ABSTRACT

Embodiments disclosed herein include a substrate support having a sensor assembly, and processing chamber having the same. In one embodiment, a substrate support has a puck. The puck has a workpiece support surface and a gas hole exiting the workpiece support surface. A sensor assembly is disposed in the gas hole and configured to detect a metric indicative of a deflection of a workpiece disposed on the workpiece support surface, wherein the sensor assembly is configured to provide the benefit of allowing gas to flow past the sensor assembly when positioned in the gas hole.

11 Claims, 9 Drawing Sheets

(51) Int. Cl.
    *H01L 21/683*     (2006.01)
    *C23C 16/458*     (2006.01)
    *G01L 11/02*     (2006.01)
    *G01D 11/24*     (2006.01)

(52) U.S. Cl.
    CPC ............... *G01D 5/26* (2013.01); *G01D 5/266* (2013.01); *G01D 5/268* (2013.01); *G01D 11/245* (2013.01); *G01L 11/025* (2013.01); *H01J 2237/334* (2013.01)

(56) References Cited

U.S. PATENT DOCUMENTS

| | | | |
|---|---|---|---|
| 2003/0038112 A1* | 2/2003 | Liu | ..................... H01J 37/3299 216/60 |
| 2004/0031338 A1 | 2/2004 | Chen et al. | |
| 2015/0138687 A1 | 5/2015 | Boyd, Jr. et al. | |

FOREIGN PATENT DOCUMENTS

| | | |
|---|---|---|
| JP | H06163674 A | 6/1994 |
| JP | H09283608 A | 10/1997 |
| JP | 2000031252 * | 1/2000 |
| JP | 2000031252 A | 1/2000 |
| JP | 2008539598 A | 11/2008 |
| JP | 2011243834 A | 12/2011 |
| JP | 2011258756 A | 12/2011 |
| KR | 20040000104 A | 1/2004 |
| KR | 20080048676 A | 6/2008 |

OTHER PUBLICATIONS

International Search Report and Writen Opinion for PCT/US2016/044989 dated Oct. 28, 2016 (10 pgs.).
Office Action from Taiwan Patent Application No. 105126313 dated Feb. 26, 2019.
Office Action from Japanese Patent Application No. 2018-512877 dated Sep. 3, 2020.
Office Action from Chinese Patent Application No. 201610815239.3 dated Feb. 27, 2023.
Office Action from Korean Patent Application No. 10-2018-7010116 dated Mar. 30, 2023.

* cited by examiner

SUBSTRATE SUPPORT WITH REAL TIME FORCE AND FILM STRESS CONTROL

CROSS-REFERENCE TO RELATED APPLICATIONS

This application is a continuation of co-pending U.S. patent application Ser. No. 14/852,485, filed Sep. 11, 2015, which is hereby incorporated herein by reference.

BACKGROUND

Field

Embodiments of the present invention generally relate to substrate supports used in processing chambers for fabricating microelectronic devices.

Description of the Related Art

In high precision manufacturing, for example semiconductor manufacturing, a workpiece may need to be precisely held by a fixture during manufacturing operations to increase uniform quality and reduce defects. In some manufacturing operations a substrate support may be used as the fixture to hold the workpiece against a supporting structure. An electrostatic force or other force ("clamping force") often is used to precisely hold the workpiece to a workpiece support surface of the substrate support during one or more manufacturing operations.

In high precision manufacturing operations, workpieces should be held with as minimal clamping force as possible with the lowest possible contact to the workpiece support surface to reduce defects. However, because of manufacturing variances such as surface treatments applied to workpieces that can alter the chucking force, wear and contamination of the substrate support's support surface, and because of other environmental effects, manufacturing personnel often find themselves increasing the target clamping force to provide a factor of safety to ensure that a sufficient clamping force is being applied to counter the aforementioned variances and effect of those variances on the chucking forces.

A large majority of the substrate supports used in semiconductor manufacturing industry often apply clamping forces that are greater than necessary, i.e., over-chucking. Over-chucking causes damage to the workpiece, for example, by causing craters in a backside of the workpiece, embedding parts of the substrate support into the workpiece, increasing film stress in the workpiece, and/or causing particulates which may cause quality problems on the processing side of the workpiece. Additionally, imbalanced chucking force in different zones of the workpiece along with vibration of the workpiece result in inconsistent yield related issues.

Conventional approaches to reduce the over-chucking problem have included measuring an electrical potential of the workpiece before the clamping force is applied which can impact the clamping force. The conventional approach then utilizes the measured electrical potential in an algorithm to compensate for the electrical potential of the workpiece during clamping to determine and apply a minimum clamping force. However, even using the conventional approach methodology, the workpiece may still often be over-chucked, and consequently still be damaged. As manufacturing tolerances become increasingly tighter and the need to reduce costs becomes more important, new approaches are needed which provide a more consistent and predictable clamping force for accommodating a wider range of manufacturing variances.

Therefore, there is a need for an improved substrate support.

SUMMARY

Embodiments disclosed herein include a substrate support having a sensor assembly, and processing chamber having the same. In one embodiment, a substrate support has a puck. The puck has a workpiece support surface and a gas hole exiting the workpiece support surface. A sensor assembly is disposed in the gas hole and configured to detect a metric indicative of a deflection of a workpiece disposed on the workpiece support surface, wherein the sensor assembly is configured to allow gas to flow past the sensor assembly when positioned in the gas hole.

In another embodiment, a processing chamber has an interior chamber volume. A substrate support is disposed in the interior chamber volume. The substrate support has a puck. The puck has a workpiece support surface and a gas hole exiting the workpiece support surface. A sensor assembly is disposed in the gas hole and configured to detect a metric indicative of a deflection of a workpiece disposed on the workpiece support surface, wherein the sensor assembly is configured to allow gas to flow past the sensor assembly when positioned in the gas hole.

In yet another embodiment, a substrate support has a puck. The puck has a workpiece support surface and a lift pin disposed in the puck. A sensor assembly is disposed in the lift pin and configured to detect a metric indicative of a deflection of a workpiece disposed on the workpiece support surface.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings and included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

So that the manner in which the above recited features of embodiments of the present invention can be understood in detail, a more particular description of embodiments of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for embodiments of the invention may admit to other equally effective embodiments.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein; rather, these embodiments are provided so that this disclosure will satisfy applicable legal requirements. Whenever possible, like reference numbers will be used to refer to like components or parts.

Embodiments disclosed herein include a sensor assembly that includes one or more of a sensor housing and a deflection sensor. The sensor assembly is configured to be disposed within a substrate support assembly, such as an electrostatic chuck, pedestal, vacuum chuck, heater, or other suitable assembly for holding a workpiece while processing in a processing chamber. For example, the sensor assembly may be disposed in an existing backside gas delivery hole of the substrate support assembly. The deflection sensor may provide real-time measurements of the deflection in a workpiece, i.e., such as a semiconductor wafer or substrate, disposed on the substrate support assembly and caused to deflect by the clamping or other forces applied to the workpiece. By using the deflection sensor to determine a deflection of a workpiece on the substrate support assembly, a control system may use the measured deflection of the workpiece to determine the force applied to the workpiece. The control system utilizes information from the deflection sensor to modify the clamping force applied to the workpiece and maintains a target clamping force. In this manner, the clamping force may secure the workpiece to the substrate support assembly and prevent substrate damage resulting from unnecessary excess deflection of the workpiece due to excess clamping forces during manufacturing operations.

Figure 1:
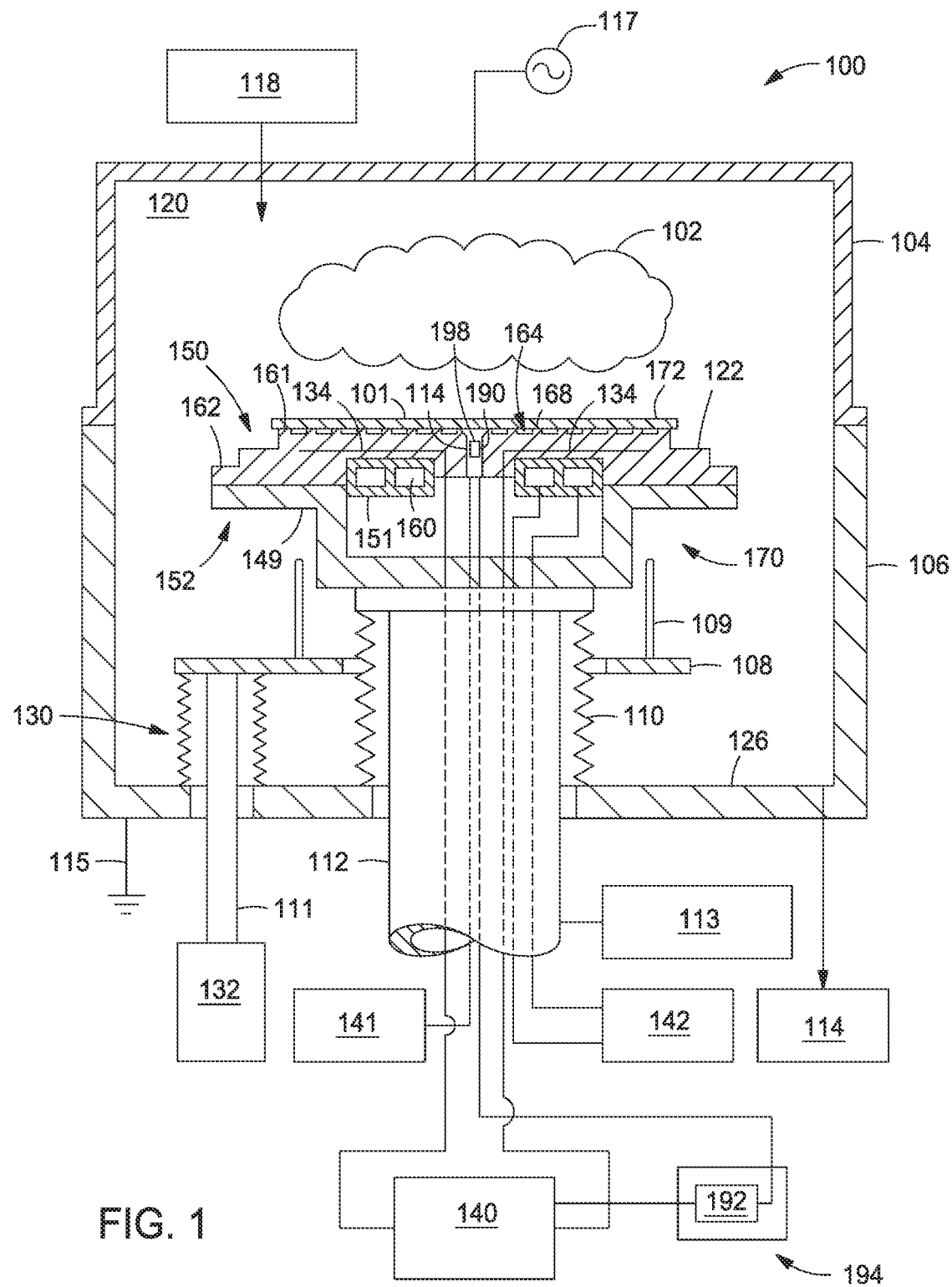
FIG. 1 is a schematic side view of an exemplary plasma processing chamber having a substrate support installed within.

FIG. 1 illustrates one embodiment of the sensor assembly 190. FIG. 1 depicts a schematic view of an exemplary plasma processing chamber 100 having a substrate support assembly 170 installed therein. The substrate support assembly 170 has a sensor assembly 190 disposed therein. In one embodiment, the plasma processing chamber 100 is a sputter etch processing chamber or a plasma etch system. However, other types of processing chambers, such as physical vapor deposition (i.e., sputtering) chambers, chemical vapor depositional chambers, or other vacuum processing chambers, may also be used to practice the embodiments disclosed herein.

The processing chamber 100 is a vacuum chamber which may be suitably adapted to maintain sub-atmospheric pressures within a chamber interior volume 120 during processing of a workpiece 101, such as a substrate, for example a silicon wafer. The processing chamber 100 includes a chamber body 106 having a bottom surface 126 and is covered by a lid 104 which encloses the chamber interior volume 120. The chamber body 106 and the lid 104 may be made of a metal, such as aluminum or other suitable material.

The processing chamber 100 is coupled to and in fluid communication with a vacuum system 114 which includes a throttle valve (not shown) and vacuum pump (not shown) which are used to pump down and exhaust the processing chamber 100. The pressure inside the processing chamber 100 may be regulated by adjusting the throttle valve and/or vacuum pump. The processing chamber 100 is also coupled to and in fluid communication with a process gas supply 118 which may supply one or more process gases to the processing chamber 100, such as argon, oxygen, chlorine, or other gas suitable for processing the workpiece 101.

An RF plasma power supply 117 may energize the process gases to maintain a plasma 102 for processing the workpiece 101. Optionally, the substrate support assembly 170 may bias the workpiece 101 to attract the ions from the plasma 102 thereto. Process gases, such as chlorine, are introduced into the processing chamber 100 from a process gas supply 118 and the gas pressure is adjusted to a preset value for plasma ignition. The plasma 102 is ignited in the chamber interior volume 120 through capacitive coupling when RF power is delivered. An RF match (not shown) may be adjusted or preset to improve the efficiency of power transfer from the RF plasma power supply 117 to the plasma 102.

Within the chamber interior volume 120 is disposed the substrate support assembly 170. The substrate support assembly 170 has a workpiece support surface 172 upon which the workpiece 101 rests during processing. The substrate support assembly 170 may include a vacuum chuck, an electrostatic chuck, a susceptor, a heater, or other substrate support suitable for supporting the workpiece 101 within the processing chamber 100 during processing.

In one embodiment, the substrate support assembly 170 includes an electrostatic chuck 122. The substrate support assembly 170 may additionally include a cooling plate 151, and a support base 152. The support base 152 may include a support housing 149, bellows assembly 110 and a support shaft 112. The support shaft 112 may be coupled to a lift mechanism 113 which may provide vertical movement of the substrate support assembly 170 between an upper, processing position, as shown, and a lower workpiece transfer position (not shown). The bellows assembly 110 may be disposed about the support shaft 112 and may be coupled between the support base 152 and the bottom surface 126 of the processing chamber 100 to provide a flexible seal that allows vertical motion of the substrate support assembly 170 while preventing loss of vacuum from within the processing chamber 100.

Temperature regulation of the workpiece 101 disposed on the substrate support assembly 170 may be facilitated by multiple cooling channels 160 which are disposed in the cooling plate 151. The cooling channels 160 are coupled to and in fluid communication with a fluid source 142 which provides a coolant fluid, such as water, although any suitable coolant fluid, gas or liquid, may be used.

The substrate support assembly 170 may include a substrate lift 130 for supporting the workpiece 101 spaced above the workpiece support surface 172 during transfer into and out of the processing chamber 100 by a robot (not shown). The substrate lift 130 may include lift pins 109 aligned with a platform 108 connected to a shaft 111. The substrate support assembly 170 may include through holes (not shown) to receive the lift pins 109 therethrough when the lift pins 109 are in the elevated position, for example when supporting the workpiece 101. The substrate lift 130 is coupled to a second lift mechanism 132 for extending the lift pins 109 through the through holes to support the workpiece 101 in a position above the workpiece support surface 172 to facilitate robotic transfer of the workpiece 101. The substrate lift 130 additionally lowers the lift pins 109 below the workpiece support surface 172 so as to place the workpiece 101 on the workpiece support surface 172.

The electrostatic chuck 122 includes a puck 150. The puck 150 may include heating elements. The temperature of the puck 150, the cooling plate 151, and/or other components of the electrostatic chuck 122 may be monitored using one or more temperature sensors (not shown), such as thermocouples and the like, coupled to one or more temperature monitors. In one example, the puck 150 is coupled to at least one thermocouple for temperature monitoring.

The puck 150 supports and chucks, i.e., applies a clamping force (Fc) to, the workpiece 101. The puck 150 may include an electrically insulative puck base 162 having electrodes 134 embedded therein for generating the clamping force (Fc). The electrodes 134 are electrically connected to a chucking power source 140, such as a DC power supply. The electrodes 134 supply the clamping force (Fc) for chucking the workpiece 101 to the workpiece support surface 172 of the puck 150. The electrodes 134 may be made of any suitable electrically conductive material, such as a metal or metal alloy. Power to the electrodes 134 may be controlled by a control system 194 coupled to the chucking power source 140. In one example, the puck 150 includes one electrode 134 for chucking the workpiece 101. The electrode 134 may be a thin disk or wire disposed within the puck base 162. In another example, the puck 150 includes two or more electrodes 134 for chucking the workpiece 101. The electrodes 134 may each be thin semicircular or "D" shaped plates which may operate independently from each other. However, the one or more electrodes 134 may have any suitable shape, which may include rings, wedges, strips, and so on.

Mesas 168 and recess 164 are disposed on the workpiece support surface 172 of the puck base 162. The workpiece support surface 172 may additionally contain one or more of grooves and channels or other geometries. The workpiece 101 may be supported on the mesas 168 and elevated above the recesses 164. The recess 164 may be in fluid communication with a gas supply 141 to provide a fluid, such as a backside gas, between the mesas 168. The backside gas may be delivered from the gas supply 141 to the recess 164 through one or more backside gas delivery holes 198 formed in the puck 150. The backside gas may flow between the workpiece 101 and the puck 150 in order to help regulate the rate of heat transfer between the puck 150 and the workpiece 101. In one example, the backside gas may comprise an inert gas, such as argon.

Figure 8:
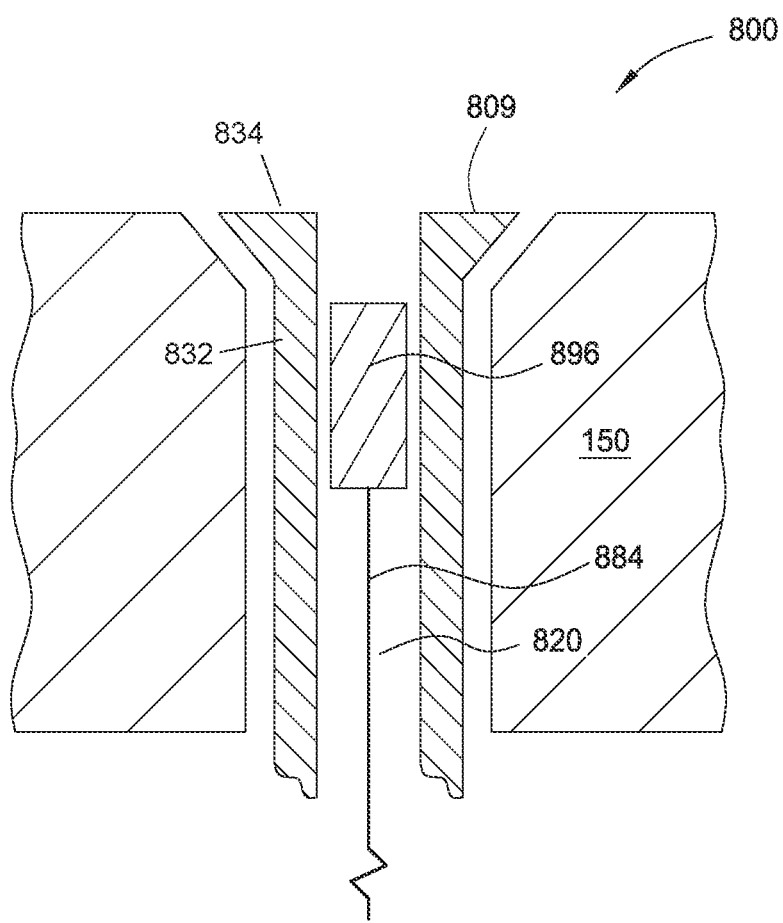
FIG. 8 is a partial cross-sectional perspective view of the substrate support having a sensor assembly mounted in a lift pin.

The sensor assembly 190 may be disposed in a through hole formed in the puck 150, such as the backside gas delivery hole 198. Alternately, as shown in FIG. 8, a sensor assembly 896 may be disposed in a hollow 820 of a lift pin 809. The sensor assembly 896 is substantially similar to sensor assembly 190 and includes the sensor 280 and may additionally include one or more of the other components of the sensor assembly 190. In yet another embodiment, the sensor assembly 190 may be mounted in the recess 164 or other suitable location. The sensor assembly 190 may be porous and allow fluid, such as the backside gas, to traverse therethrough. For example, the sensor assembly 190 may have passages that permit fluid to pass through the sensor assembly 190.

The sensor assembly 190 may be in communication with the control system 194. The sensor assembly 190 measures the deflection of the workpiece 101 on the workpiece support surface 172. The controller 192 determines the clamping force Fc applied to the workpiece 101 based on the deflection measured by the sensor assembly 190. In this manner, the controller 192 may adjust the clamping force Fc by adjusting the clamping voltage Vc provided to the electrode 134 by the chucking power source 140 so as to maintain a desired clamping force Fc. By maintaining a desired clamping force Fc through real-time monitoring of the actual clamping force (via the sensor assembly 190) and real-time adjustment of the power provided to the electrodes 134, damage to the workpiece 101 from the electrostatic chuck 122 can be reduces compared to conventional chucking techniques.

Although the sensor assembly 190 is shown mounted in a puck 150 of FIG. 1, advantageously, a similar arrangement for mounting of the sensor assembly 190 may be extended to other products where it is required to measure the deflection of the parts in nanometers or at the microns level. However, the following discussion of the sensor assembly 190 and the advantages will be discussed with regards to the puck 150 described above. For example, the operating parameters for puck 150 may be advantageously controlled with a feedback loop relying on the data provided by the sensor assembly 190. The measurement of deflection by the sensor assembly 190 can be extended to additionally calculate the vibration and the force exerted on the workpiece 101 for relieving film stress and maintaining a planar surface on the workpiece 101 for reducing variations and defects in the film layers formed on the workpiece 101 during processing.

Figure 2:
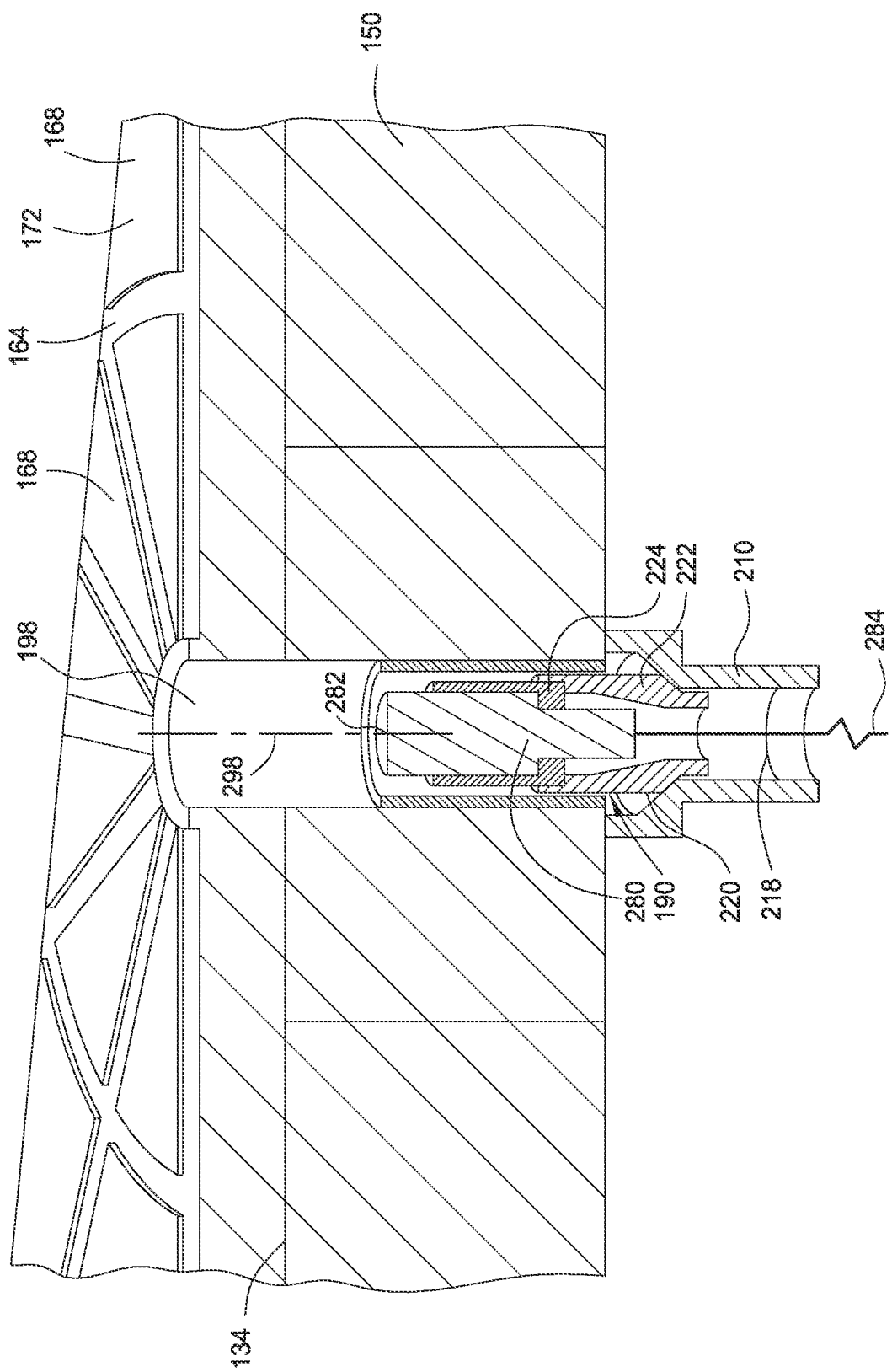
FIG. 2 is a partial cross-sectional isometric view of the substrate support having a sensor assembly mounted in a backside gas through hole.

FIG. 2 is a partial cross-sectional view of the electrostatic chuck 122 shown in FIG. 1 having the sensor assembly 190 mounted in the backside gas delivery hole 198. A vertical line 298 is provided which is perpendicular to the workpiece support surface 172. The vertical line 298 is merely illustrative and does not necessarily reside in the backside gas delivery hole 198 or other holes in the puck 150. The shape of the hole in which the sensor assembly is mounted in the puck 150 is not limited to circular holes. The hole can be laser drilled, machined or formed in another manner.

A backside gas passage 218 may include the backside gas delivery hole 198 and a transition conduit 210 connected thereto for providing a backside gas to the workpiece support surface 172 of the puck 150. In embodiments wherein the sensor assembly 190 disposed in the backside gas delivery hole 198 is hardwired to the control system 194, communication connections 284 between the sensor assembly 190 and the control system 194 may traverse at least partially through the backside gas passage 218. In embodiments wherein the sensor assembly 896 is disposed in the hollow 820 of the lift pin and hardwired to the control system 194, as shown in FIG. 8, a communication connection 884 between the sensor assembly 896 and the control system 194 may traverse at least partially through the lift pin hole in the electrostatic chuck 122.

Figure 3:
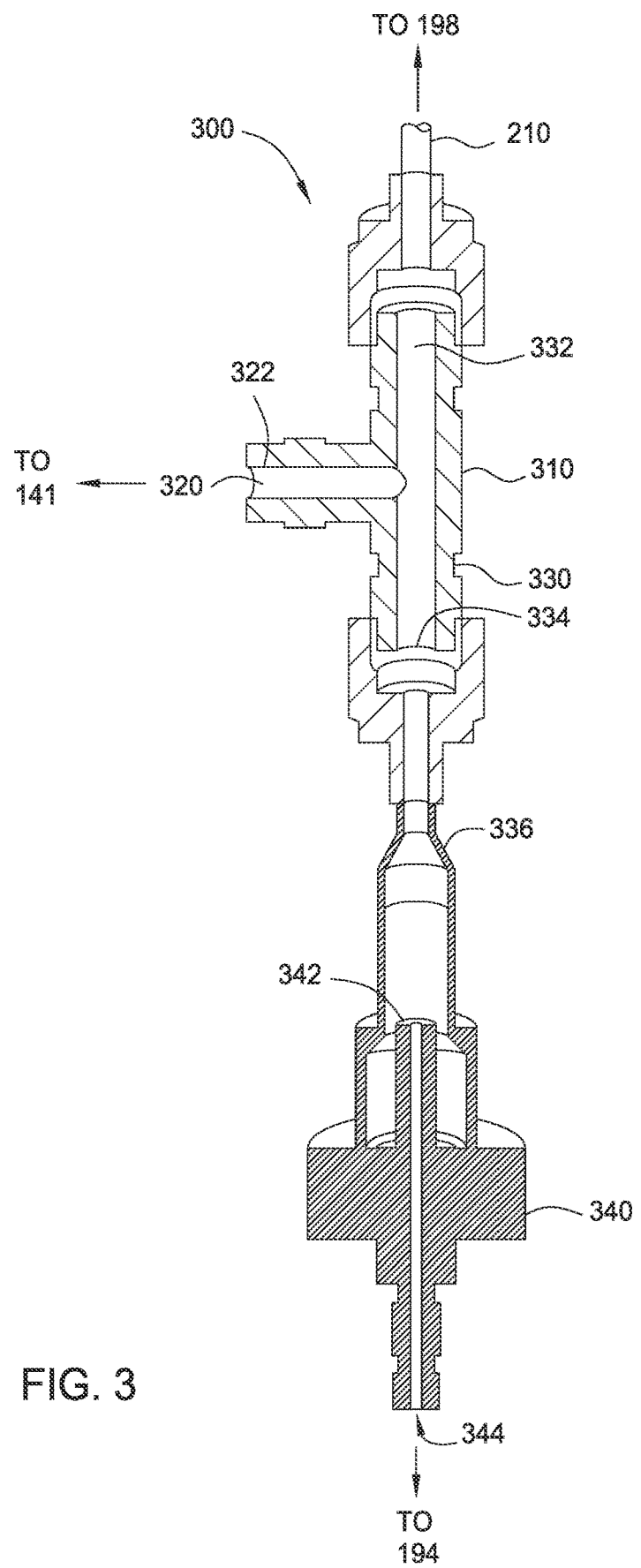
FIG. 3 is a cross-sectional isometric view depicting vertical connection between the sensor assembly in the backside gas through hole and the control system.

Referring briefly to FIG. 3, FIG. 3 is a cross-sectional view depicting vertical connection 300 between the sensor assembly 190 in the backside gas delivery hole 198 and the controller 192. The transition conduit 210 may couple with a tee connection 310. Alternately, an amount of conduit or other suitable means for maintaining the backside gas passage 218 may be coupled between the transition conduit 210 and the tee connection 310. Although the tee connection is shown with one opening 322 (third opening) on a horizontal passageway 320 and two openings 332, 334 (first and second opening respectfully) on a vertical passageway 330, it is contemplated the tee connection 310 may be rotated 90 degrees or so such that there may be a second opening on the horizontal and only one opening on the vertical. In other embodiments, the tee connection 310 may be replaced with another suitable gas connector. For example, tee connection 310 may have a plurality of openings, such as four. The tee connection 310 may have a first opening fluidly coupled to the transition conduit 210. A second and a third opening may be fluidly coupled to fluid sources. Lastly, the fourth and final opening may be coupled to the control system 194.

In the embodiment of FIG. 3, the first opening 332 of the tee connection 310 is coupled to the transition conduit 210. However, as discussed above, other configurations for connecting the sensor assembly 190 to the control system 194 while allowing gas delivery through the sensor assembly 190 are contemplated. In one embodiment, the second opening 334 may be coupled to a connector 336. The connector 336 is adapted to interface with a wiring thru-fitting 340. The wiring thru-fitting 340 has a channel 342 configured to interface with the communication connections 284. The wiring thru-fitting 340 seals the connector 336 from fluid loss while permitting the communication connections 284 to transmit communication signals therethrough. In one embodiment, the channel 342 is formed in a gasket material that provides a seal between the wiring thru-fitting 340 and the communication connections 284. In another embodiment, the channel 342 may be a connector, such as a pin connector, which the communication connections 284 may plug into.

Backside gas enters the tee connection 310 via the third opening 322. The gas supply 141 is fluidly coupled to the first opening 332. The backside gas enters the tee connection 310 through the opening 322 and exits the tee connection 310 via the first opening 332 that is connected to the backside gas delivery hole 198 on the electrostatic chuck 122.

In another embodiment, the backside gas enters the tee connection 310 via the opening second 334. The wiring thru-fitting 340 is attached to the third opening 322 to fluidly seal the third opening 322 while allowing communication between the sensor assembly 190 and the control system 194. In yet other embodiments, the tee connection 310 splits the fluid source for the backside gas and the communication to the control system 194 from the backside gas delivery hole 198 of the puck 150.

Returning to FIG. 2, the sensor assembly 190 includes a sensor 280 and a sensor housing 220. The sensor 280 may be a fiber optic based sensors, such as a Fabry-Pérot sensor (FPS), or interferometer, or other sensor suitable for measuring small deflections. In one embodiment, the sensor 280 is an FPS. The sensor 280 communicates with the control system 194. In one embodiment, the sensor 280 may have communication connections 284 hardwired to the controller 192 in the control system 194. In another embodiment, the sensor assembly 190 may communicate wirelessly with the control system 194. The sensor 280 may measure a metric indicative of a distance to the workpiece (not shown) disposed on the puck 150 and provide the metric to the control system 194 in real-time for analysis by the control system 194 or other suitable device.

The sensor 280 may have a sensor head 282. The sensor head 282 may emit and receive signals for making distance measurements. The sensor 280 may be precision mounted in the puck 150 such that a distance between the sensor head 282 and any object, such as a workpiece (not shown), can be measured in real-time to determine relative displacement with nanometer accuracy. The sensor 280 may be precisely mounted within the transition conduit 210 of the backside gas passage 218. The sensor housing 220 holds the sensor 280 in the backside gas passage 218. The sensor head 282 may be aligned within +/−3 degrees of the vertical line 298, or in other words, +/−3 degrees from a perpendicular of the workpiece support surface 172. The distance of the sensor head 282 can be precisely adjusted from about less than 5 mm from the top of the mesas 168 to about 300 mm from the top of the mesas 168 by adjusting the position of the sensor housing 220 within the puck 150.

The sensor 280 may include a radiation emitter to emit radiation and a radiation detector to measure the portion of the radiation reflected by the workpiece 101. The radiation, or signal, may be, for example, electromagnetic radiation having a wavelength between about 600 nanometers and about 1700 nanometers. The radiation detector in the sensor 280 measures the return path for the radiation signal emitted. Thus, the angle and location of the sensor 280 may affect the measurement. The sensor housing 220 holds the sensor 280 in a precise location and orientation for facilitating accurate measurements.

Figure 4A:
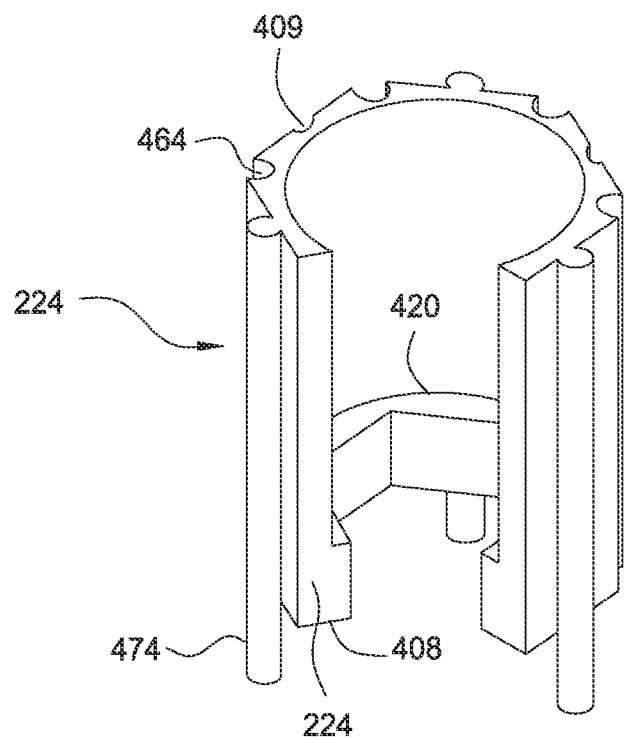
FIG. 4A is a isometric view of a split plate of a sensor housing.
Figure 4B:
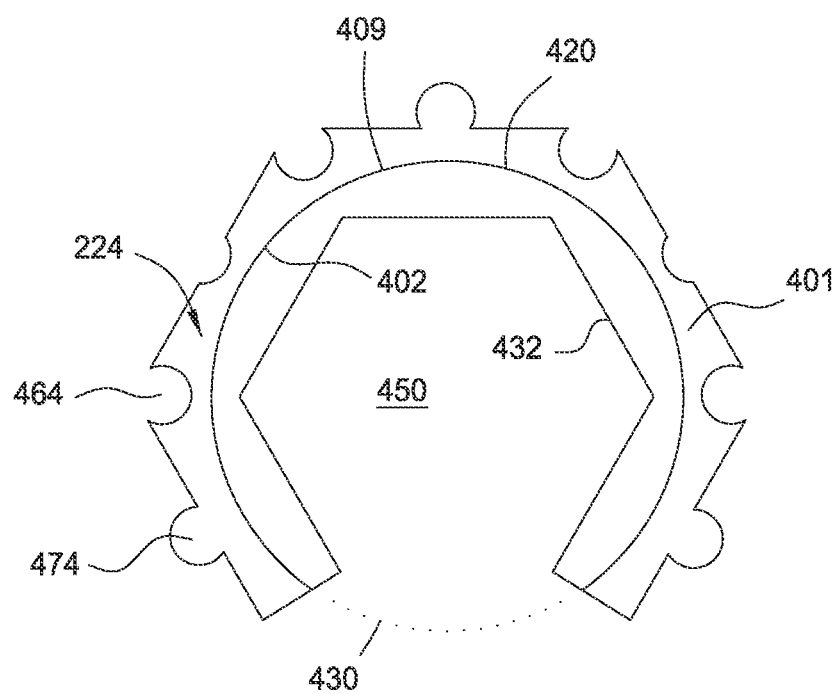
FIG. 4B is a plan view of the split plate.
Figure 5:
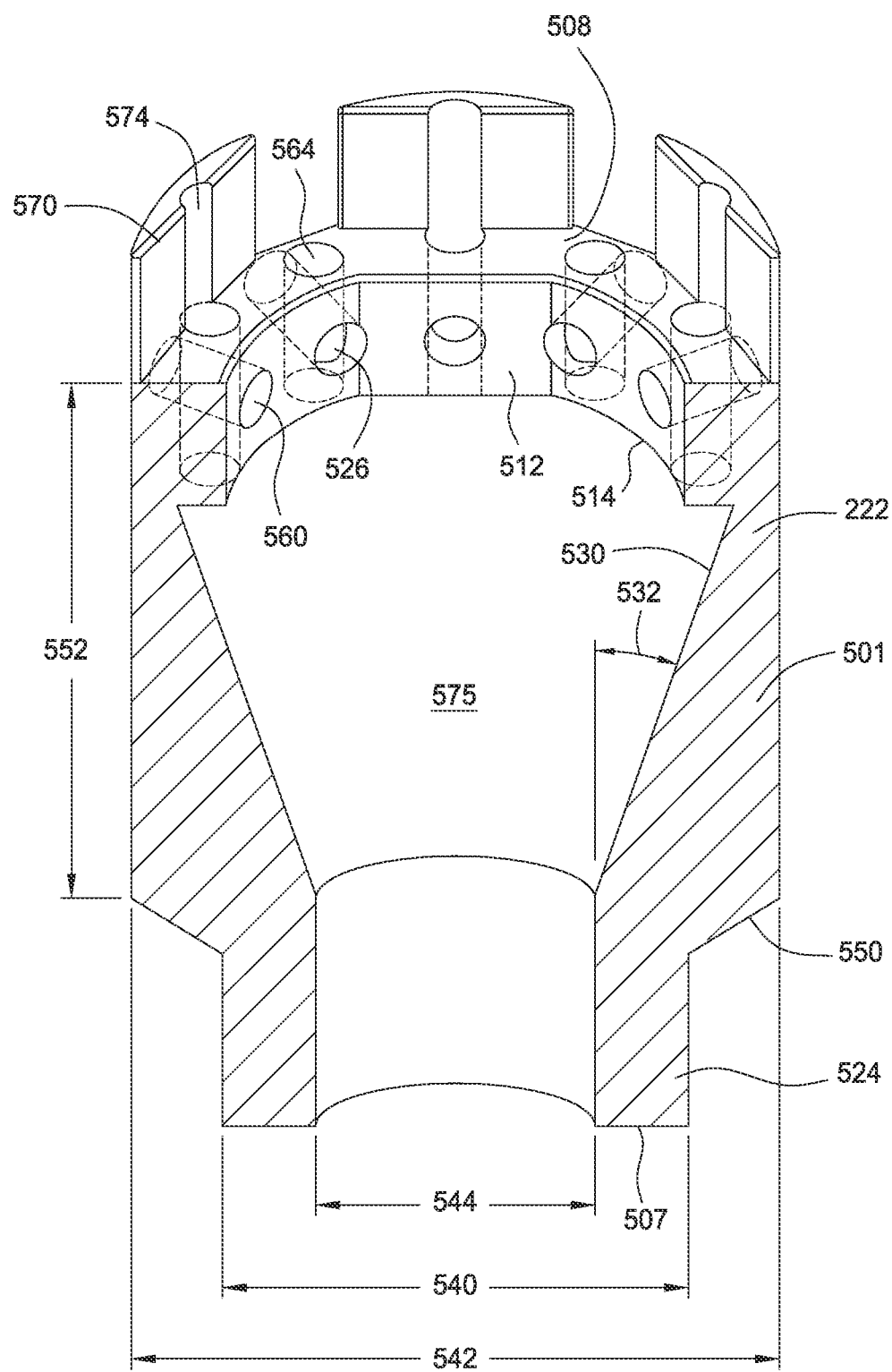
FIG. 5 is a cross-sectional perspective view of a mounting head of the sensor housing.

The sensor housing 220 may include a split plate 224 and a mounting head 222. The split plate 224 and mounting head 222 are discussed here with additional reference made to FIGS. 4A, 4B and 5. FIG. 4A is a prospective view of the split plate 224 for the sensor assembly 190. Self-alignment of the sensor 280 can be achieved with the conical mounting head 222 in conjunction with the hexagonal split plate 224. FIG. 4B is a plan view for the split plate 224. FIG. 5 is a cross-sectional view for the mounting head 222 of the sensor assembly 190.

The mounting head 222 and split plate 224 may both be formed from a polymer suitable for low temperature operations. Alternately, the mounting head 222 and split plate 224 may be formed from a ceramic or metal material suitable for either high or low temperature applications. The mounting head 222 and split plate 224 may be made of metal such as stainless steel (SST), titanium, aluminum, tungsten, nickel or other alloy. Alternately, the mounting head 222 and split plate 224 may be made of a ceramic material such as alumina or aluminum nitride, or quartz. The mounting head 222 and split plate 224 can also be 3D printed either in a metal or ceramic material.

The sensor housing 220 is configured to allow gas to flow through the sensor assembly 190. The sensor housing 220 may be porous. The mounting head 222 and split plate 224 may both be porous and may additionally or alternately have multiple holes or slots to allow the backside gas to flow therethrough. For example, as shown in FIG. 5, the mounting head 222 has holes 526, 564 for allowing gas to pass through the sensor assembly 190. Additionally, as shown in FIGS. 4A and 4B, the split plate 224 has a plurality of holes 464. The holes 464 in the split plate 224 align with the holes 564 in the mounting head 222 to promote fluid to flow through the sensor assembly 190. The holes 526, 564 may extend through the mounting head 222. The mounting head 222 and split plate 224 may be precision machined with the holes 526, 564, 464, such as 4 or more, along a peripherally to allow the backside gas to flow through the sensor assembly 190. Alternatively, the plurality of holes 526 may be formed in the mounting head 222 and split plate 224 during an additive manufacturing process such as 3D printing. The number of holes 526, 564, 464 can range from about 1 to about 100 or more to adjust the conductance of the fluid flowing therethrough. Alternatively, the sensor housing 220 may be formed from a porous material, such as porous ceramic, to further improve the backside gas flow when the sensor 280 is mounted in the backside gas delivery hole 198 or other through holes.

Turning briefly to FIGS. 4A and 4B, the split plate 224 has a body 401. The body 401 may be ringed shaped. The body 401 may optionally have a side opening 430. The body 401 has a central opening 450. In one embodiment, the body 401 is a hexagonal ring with one facet of the hexagon missing to form the side opening 430. In another embodiment, the body 401 may have a circular ring shape, having a segment of the body 401 missing to effectively form the side opening 430.

The central opening 450 may have an inner perimeter 402. The central opening 450 may have an inner ledge 420 extending from the inner perimeter 402 into the central opening 450. The inner ledge 420 may have an inner perimeter 432. The inner perimeter 402 of the central opening 450 is sized to allow the sensor 280 to pass therethrough. The inner perimeter 432 of the inner ledge 420 is smaller than the inner perimeter 402 of the central opening 450. The inner perimeter 432 of the inner ledge 420 is also smaller than the width of the sensor 280 such that the sensor 280 may be supported by the inner ledge 420. In this manner, the position of the sensor 280 in the split plate 224 may be configured to precisely arrange the sensor 280 within the backside gas delivery hole 198.

The body 401 of the split plate 224 has a plurality of holes 464. The holes 464 extend from the top surface 409 to the bottom surface 408. In one embodiment, the split plate 224 has 4 holes 464. In another embodiment, the split plate 224 has 6 or more holes 464. The holes 464 are configured to permit fluid to flow past the body 401 of the split plate 224 when the sensor assembly 190 is mounted in the backside gas delivery hole 198. Advantageously, the sensor assembly 190 may be installed inside an existing fluid delivery hole in a conventional electrostatic chuck, thus allow a retrofit of an existing electrostatic chuck without the sensor assembly 190 interfering with the flow of fluid through the hole accommodating the sensor assembly 190.

The body 401 of the split plate 224 additionally has one or more pins 474. The pins 474 extend from the top surface 409 past the bottom surface 408. In one embodiment, the split plate 224 has three pins 474 for interfacing with and locating the split plate 224 in the mounting head 222.

Turning briefly to FIG. 5, the mounting head 222 has a plurality of receiving holes 574. The receiving holes 574 in the mounting head 222 accept the pins 474 from the split plate 224. Thus, the split plate 224 may be aligned with the mounting head 222 in a predetermined manner.

The mounting head 222 has a body 501. The body 501 may have a bottom surface 507 and a top surface 508. The body 501 may be ring shaped and have an interior opening 575 extending from the bottom surface 507 to the top surface 508. A plurality of fins 570 may extend above the top surface 508. The fins 570 provide stability to the joint between the split plate 224 and the mounting head 222. Additionally, the fins 570 may assist aligning the pins 474 in the split plate 224 with the receiving holes 574 in the mounting head 222.

The body 501 may have a plurality of passageways 560, i.e. holes 526, 564, which extend through the body 501. The passageways 560 may align with the holes 464 in the split plate 224. Thus, the combination of passageways 560 and holes 464 provide a continuous conduit for the fluid to flow across the sensor housing 220 and thus through the sensor assembly 190. In one example, a fluid enters the interior opening 575 at the bottom 507 of the mounting head 222. The fluid moves upwardly through the mounting head 222 towards the top surface 508. The fluid enters the passageways 560 formed in the mounting head 222 and is directed into and past the holes 464 of the split plate 224. The fluid leaves the holes 464 at the top surface 409 of the split plate 224 and continues up the backside gas delivery hole 198 to the workpiece support surface 172 of the puck 150. Thus, the combination of passageways 560 and holes 464 together allow fluid to pass through the sensor assembly 190.

The body 501 of the mounting head 222 is configured to interface with the transition conduit 210 in the backside gas passage 218 without interfering with the fluid flowing therethrough the backside gas passage 218. The body 501 has an inner diameter 544 at the bottom surface 507. The inner diameter 544 extends upward toward the top surface 508. The inner diameter 544 transitions at an angle 532 to an inclined interior surface 530. The inclined interior surface 530 may extend outwardly from the inner diameter 544 at the angle 532 toward the top surface 508. The angle 532 and inclined interior surface 530 may be configured to effect properties of the fluid flow, such as fluid conductance, pressure or velocity.

The body 501 may additionally have a chamfer 550 on the outer surface 577. The chamfer 550 may be angled to form a press fit between the mounting head 222 and transition conduit 210. The chamfer 550 may be a prescribed distance 552 from the top surface 508. The distance 552 may be made to any size to accommodate need. For instance, the distance 552 may be sized by forming the body 501 with a longer or shorter distance 552 between the chamfer 550 and the top surface 508. Alternately, the body 501 may be formed in two sections with a first section containing the top surface 508 and the second section containing the chamfer 550. The sections may be joined together in an manner such as screwing the sections together, using a combination steps and landings, or using another suitable manner which allow the distance 552 to be modified. Advantageously, the sensor head 282, as shown in FIG. 2, can be precisely adjusted upward toward or downward away from the workpiece support surface 172 from about less than 5 mm to about 30 mm from the top of the workpiece support surface 172. The adjustment of the distance of the sensor head 282 to the workpiece support surface 172 may be modified by using mounting heads 222 of different thickness or varying the distance 552 of the chamfer 550 from the top surface 508.

Figure 6:
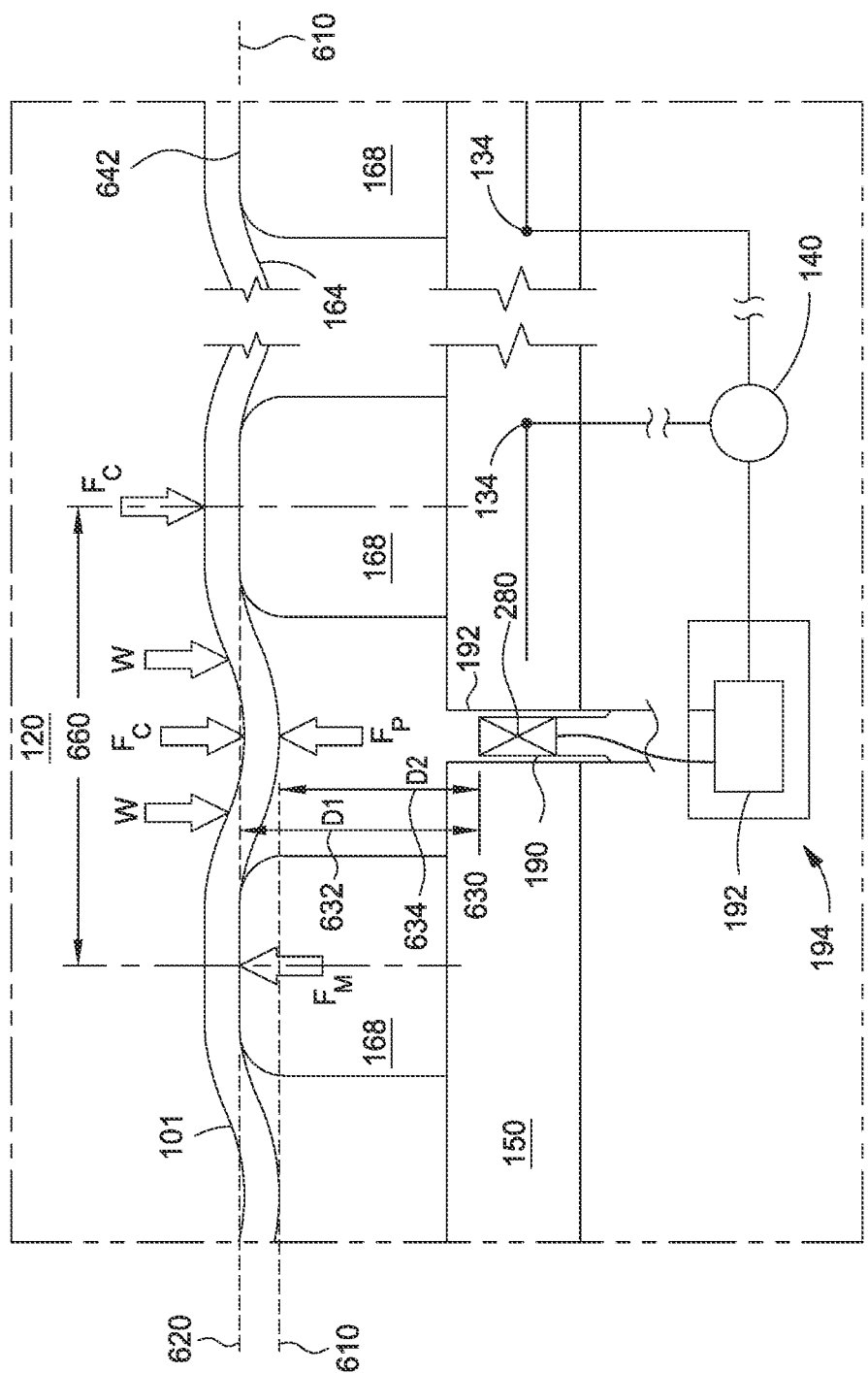
FIG. 6 is a partial cross-sectional view of the substrate support having a workpiece disposed thereon.

FIG. 6 is a partial cross-sectional view of the electrostatic chuck 122 having the workpiece 101 disposed thereon. FIG. 6 illustrates the puck 150 and mesas 168 of the electrostatic chuck 122 in close proximity to the backside gas delivery hole 198. The mesas 168 are disposed between intersecting one or more recesses 164. The mesas 168 may comprise square or rectangular blocks, cones, wedges, pyramids, posts, cylindrical mounds, or other protrusions of varying sizes, or combinations thereof that extend up from the puck 150 for supporting the workpiece 101. The workpiece 101 may be secured to the electrostatic chuck 122 with a clamping force Fc as discussed above.

Adjacent mesas 168 may have centers separated by a distance 660. In one embodiment, the distance 660 may be in a range from about 0.3 inches to about 0.5 inches. The adjacent mesas 168 may each have a height from about fifty (50) microns to about seven hundred (700) microns. The adjacent mesas 168 may each have a width in a range from about five hundred (500) microns to about five thousand (5000) microns. The recess 164 may have a width of from about two (2) millimeters to about ten (30) millimeters. The mesas 168 and recess 164 allow the electrostatic chuck 122 to support the workpiece 101 while additionally providing thermal management of the workpiece 101.

The mesas 168 have a top surface 642 that supports the workpiece 101. The top surface 642 generally defines a datum surface 620 on which the workpiece 101 rests when clamping forces Fc from the electrostatic chuck 122 are not applied. In one embodiment, the datum surface 620 is a place. The datum surface 620 may serve as a reference point from which deflection of the workpiece 101 may be measured by the sensor 280.

The workpiece 101 may be secured to the electrostatic chuck 122 once the clamping force Fc is applied. The clamping force Fc pulls the workpiece 101 towards the mesas 168 and together with the contact with the mesas 168 prevent movement of the workpiece 101 with respect to the electrostatic chuck 122. The clamping force Fc may not be identical or even substantially similar over the entire workpiece support surface 172 of the electrostatic chuck 122. The variability of the clamping force Fc may be attributed to variations in the puck 150 due to deposition of materials, erosion due to cleaning and etching, and from wear, among other reasons. Additionally, the clamping force Fc may be purposely differentiated across the workpiece support surface 172 such as in a zoned electrostatic chuck configuration.

The sensor 280 measures the deflection of the workpiece 101 relative to the datum surface 620. To control the clamping force Fc, a clamping voltage is applied to the electrodes 134 in the electrostatic chuck. The clamping voltage may be varied in response to the deflection of the workpiece 101 measured by the sensor 280. Upon applying the clamping force Fc, the workpiece 101 may be aligned with the geometric plane 610 in the recesses 164. A range depicting acceptable deflection may be compared to the measured deflection and the clamping voltage may be adjusted until the measured deflection falls within a predefined range. For example, a predefined range of acceptable deflection may be between thirty (30) microns and about seventy (70) microns. When the measured deflection is greater than about 70 microns, the clamping voltage may be reduced until the sensor determines in real-time that the deflection is between thirty (30) microns and about seventy (70) microns. The deflection may be measured with sensor assembly 190 placed at two or more locations, thus enabling precise tuning of the clamping voltage.

The sensor 280 may measure changes in the deflection of the workpiece 101 over short time intervals. The control system 194 may be able to detect vibration in the workpiece 101 using the real-time measure of the deflection from the sensor 280. The control system 194 may compare the deflection data from the sensor 280 with any changes in the clamping voltage over the same time period. For a static clamping voltage, the variation in the deflection measurement outside an acceptable range may indicate movement, or vibration, of the workpiece 101. Upon the control system 194 determining the substrate is moving, the control system 194 may adjust the clamping voltage and monitor changes in the deflection via the sensor 280. In embodiments where multiple sensors 280 monitor deflection of the workpiece 101 and the electrostatic chuck 122 is equipped with multiple clamping zones, the control system 194 may use data from individual sensors 280 located in the different clamping zones to control the clamping in that particular clamping zone. Advantageously, the control system 194 can minimize film stress in the workpiece 101.

The electrostatic chuck 122 may be equipped with multiple clamping zones and use multiple sensor assemblies 190 having sensors 280 to monitor each clamping zone. FIGS. 7A-7D are top plan views for the substrate supports, such as electrostatic chuck 122, illustrating various locations for the sensor assembly 190. The sensor assembly 190 may be located in existing holes provided in the electrostatic chuck 122. For example, the sensor assembly 190 may be located in the backside gas delivery hole 198. The sensor assembly 190 may additionally be adapted to be located a hollow of the lift pins 109. Alternately, holes may be formed in the electrostatic chuck 122 during or after manufacture of the electrostatic chuck 122 which are suited for having the sensor assembly 190 located therein. The location of the sensor assembly 190 may be determined based on existing configurations for the puck 150 of the electrostatic chuck 122.

Figure 7A:
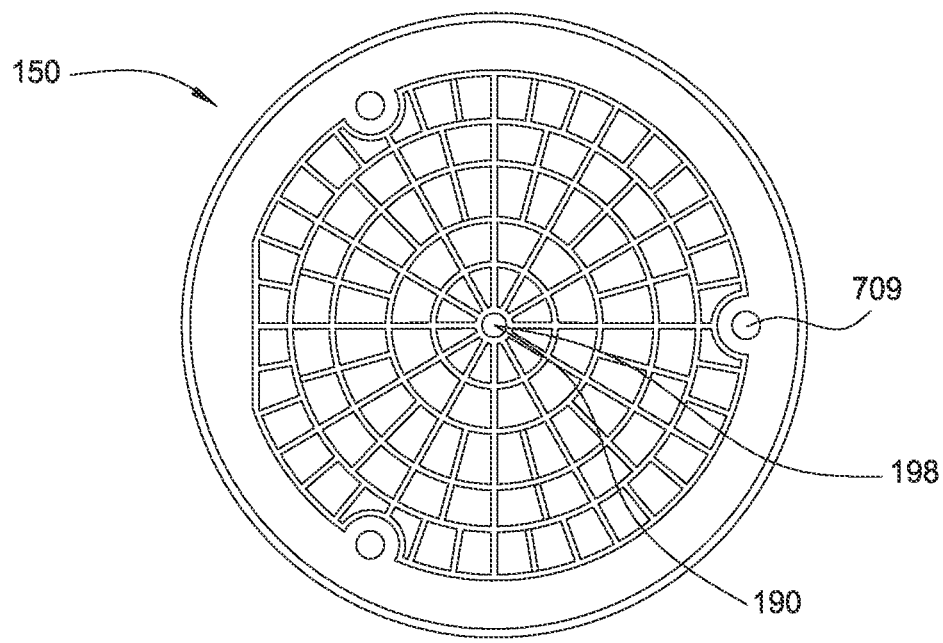
FIGS. 7A-7D are top plan views of the substrate support illustrating various locations for the sensor assembly.

FIG. 7A illustrates one embodiment wherein the sensor assembly 190 is centrally located on the workpiece support surface 172 of the puck 150 having the backside gas delivery hole 198 and lift pin holes 709. The sensor assembly 190 may be located in the backside gas delivery hole 198 in the center of the electrostatic chuck. Alternately, another suitable hole centrally located in the electrostatic chuck 122 may be utilized for locating the sensor assembly 190. Advantageously, this arrangement for the sensor assembly 190 provides data for preventing over chucking and vibration detection on the workpiece 101. The data may be utilized to reduce film stress and minimize defects in the workpiece 101. Additionally, locating the sensor assembly 190 in an existing hole formed in the puck 150 is inexpensive and allows retrofit of existing electrostatic chucks.

Figure 7B:
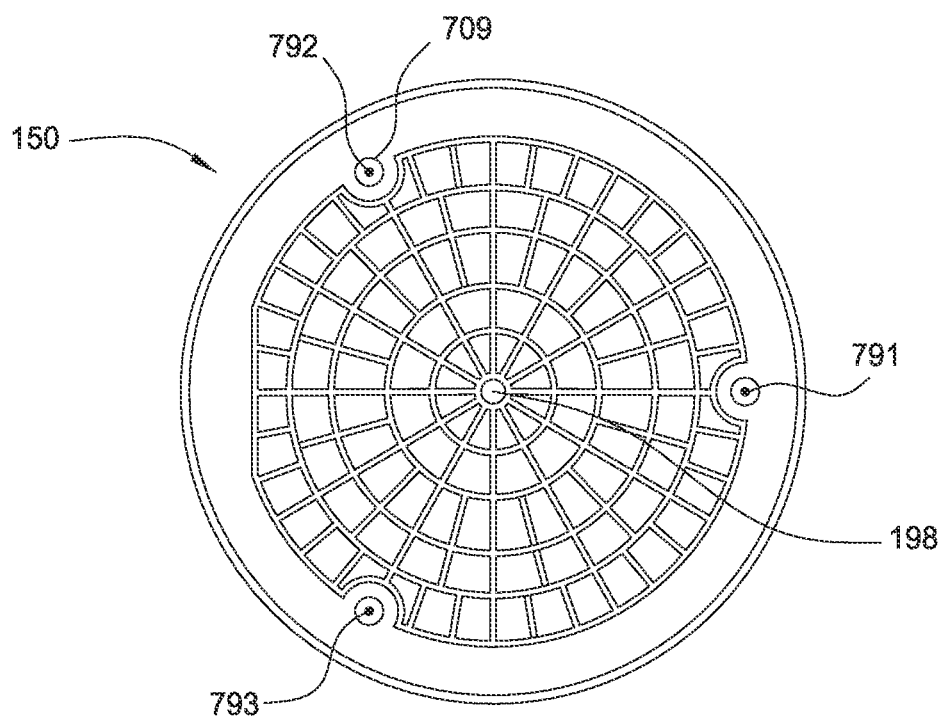

FIG. 7B illustrates a second embodiment wherein two or more sensor assemblies 791 are distally located along the workpiece support surface 172 of the puck 150 having the backside gas delivery hole 198 and lift pin holes 709. Three sensor assemblies 791 are located in the lift pin holes 709. The sensor assemblies 791 may be inside the lift pins (item 109 in FIG. 1). Alternately, the sensor assemblies 791 may circumscribe the lift pins. In yet another alternative, suitable holes in the puck 150 may be formed for placing the sensor assemblies therein. In some embodiments, the two or more sensor assemblies 791 may additionally include the central sensor assembly 190 illustrated in FIG. 1. Advantageously, this arrangement of three distally located sensor assemblies 791 provide deflection data across the workpiece for greater control of the clamping forces acting upon the workpiece 101. Additionally, this arrangement for the distally located sensor assemblies 791 may be provided on an unmodified puck 150 of the electrostatic chuck 122 and thus allows for retrofit of the electrostatic chuck 122 and has only a small implementation cost.

Figure 7C:
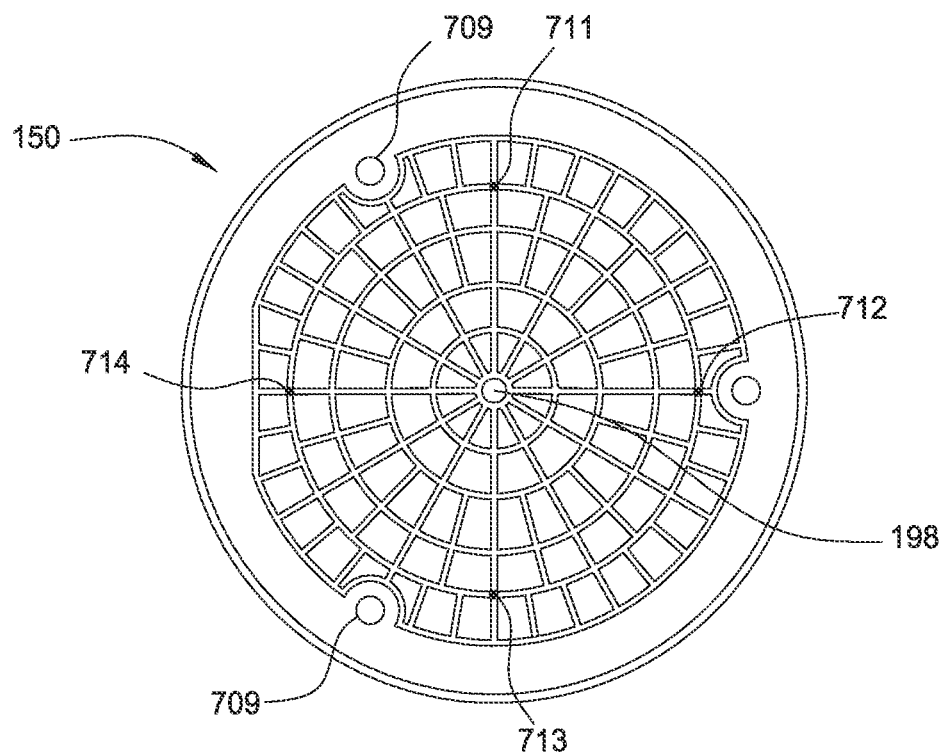

FIG. 7C illustrates a third embodiment wherein multiple sensor assemblies 711, 712, 713, 714 are distally located along the workpiece support surface 172 of the puck 150 having the backside gas delivery hole 198 and lift pin holes 709. Four sensor assemblies 711, 712, 713, 714 are located in suitable holes. The suitable holes may be backside gas holes, lift pin holes, or other holes formed in the puck 150. The sensor assemblies 711, 712, 713, 714 may detect variations in the chucking force or vibrations in the workpiece across four quadrants on the puck 150. In some embodiments, the multiple sensor assemblies 711, 712, 713, 714 may additionally include the central sensor assembly 190 illustrated in FIG. 1. Advantageously, this arrangement of the sensor assemblies 711, 712, 713, 714 provides measurements over four quadrants of the workpiece 101 for precise control of the clamping forces acting on the workpiece 101. Thus, the clamping forces Fc in each quadrant may be monitored and adjusted in realtime allowing prevention of over clamping and easy detection of vibrations in the workpiece 101.

Figure 7D:
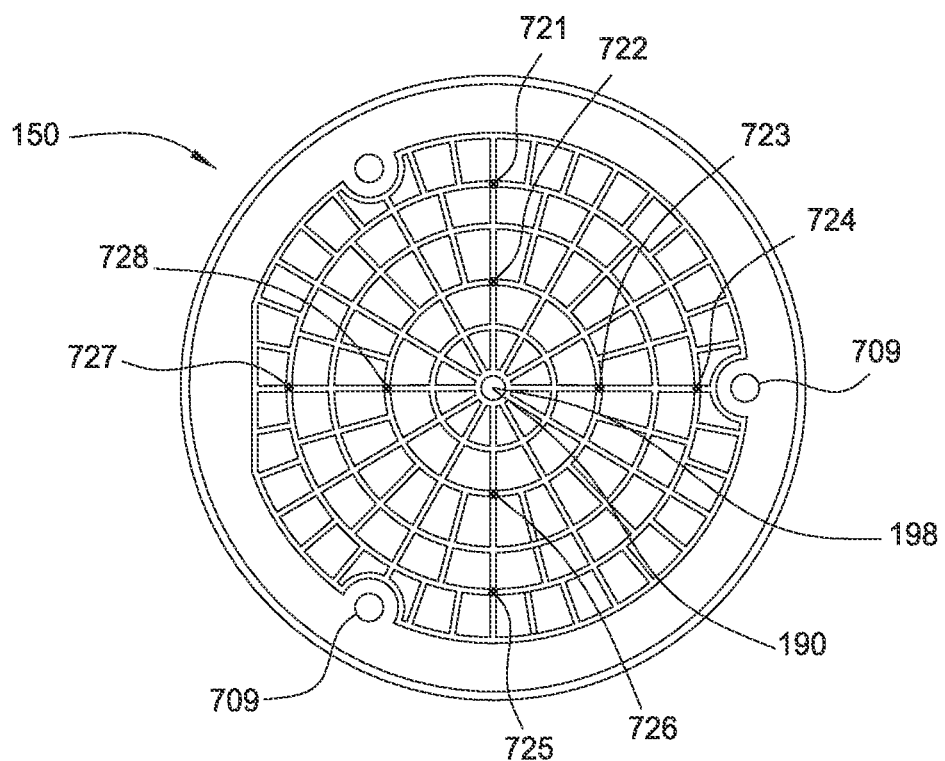

FIG. 7D illustrates a fourth embodiment wherein multiple sensor assemblies 721-728, 190 are located across the workpiece support surface 172 of the puck 150 having the backside gas delivery hole 198 and lift pin holes 709. The sensor assemblies 721-728, 190 may be placed in concentric rows and/or regions of the puck 150 corresponding to the arrangement of the chucking electrodes. For example, the electrostatic chuck 122 may have a plurality of concentrically arranged independent chucking electrodes. The sensor assemblies 721-728, may be arranged in an inner ring group 730 and an outer ring group 740. The sensor assemblies 721-728 may detect small variations in the chucking force or vibrations in the workpiece along the chucking electrodes in the puck 150. In some embodiments, the multiple sensor assemblies 721-728 may additionally include the central sensor assembly 190 illustrated in FIG. 7A and or the sensor assemblies 790-793 illustrated in FIG. 7B. Advantageously, this arrangement of the sensor assemblies 721-728 provides discrete deflection measurements over the entirety of the workpiece 101 for enhanced protection from over-chucking.

Advantageously, the sensor assembly described herein helps prevent over-chucking of a workpiece disposed on an electrostatic chuck. Preventing over-chucking also helps reduce film stress during manufacturing. The arrangements of one or more sensor assemblies may be used to prevent unbalanced chucking forces in different zones, and allows workpiece vibration to be addressed. The embodiments described above provide an easy and cost effective solution for measuring over-chucking of a workpiece on an electrostatic chuck. The use of electrostatic chucks without modification allows existing process equipment to be retro-fitted with one or more sensor assemblies in a cost effective manner, while providing a more consistent and predictable clamping force that accommodates a wider range of chuck manufacturing variances.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A sensor assembly, comprising:
   a sensor configured to detect a metric indicative of a deflection of a workpiece disposed above the sensor; and
   a porous sensor housing, the sensor disposed in the porous sensor housing, the porous sensor housing comprising:
      a split plate having a central opening with an inner perimeter disposed around the sensor; and
      a mounting head disposed below the split plate.

2. The sensor assembly of claim 1, wherein the mounting head is conical and the split plate is hexagonal.

3. The sensor assembly of claim 2, wherein mounting head comprises:
   one or more holes configured to allow gas to flow around the sensor.

4. The sensor assembly of claim 3, wherein split plate comprises:
   one or more holes configured to allow gas to flow around the sensor.

5. The sensor assembly of claim 4, wherein the holes in the split plate align with the holes in the mounting head to promote fluid to flow through the sensor assembly.

6. The sensor assembly of claim 5, wherein the sensor housing is formed from a porous ceramic material.

7. The sensor assembly of claim 4, wherein the split plate comprises:
   pins interfacing with and locating the split plate in the mounting head in an orientation that aligns holes in the mounting head with holes in the split plate.

8. The sensor assembly of claim 2, wherein the mounting head and the split plate are made from at least one of stainless steel (SST), titanium, aluminum, tungsten, nickel or a metal alloy.

9. The sensor assembly of claim 2, wherein the mounting head and the split plate are formed from a polymer.

10. The sensor assembly of claim 1, wherein the sensor further comprises:
    a fiber optic based distance measuring sensor.

11. The sensor assembly of claim 10, wherein the fiber optic based distance measuring sensor is a Fabry-Pérot sensor.

* * * * *